(12) United States Patent
Mitsui

(10) Patent No.: US 7,253,706 B2
(45) Date of Patent: Aug. 7, 2007

(54) METHOD FOR MANUFACTURING SURFACE ACOUSTIC WAVE ELEMENT, AS WELL AS SURFACE ACOUSTIC WAVE ELEMENT MANUFACTURED BY THE SAME METHOD

(75) Inventor: Yuji Mitsui, Nagano (JP)

(73) Assignee: Seiko Epson Corporation (JP)

( * ) Notice: Subject to any disclaimer, the term of this patent is extended or adjusted under 35 U.S.C. 154(b) by 177 days.

(21) Appl. No.: 11/149,493

(22) Filed: Jun. 9, 2005

(65) Prior Publication Data

US 2005/0273996 A1    Dec. 15, 2005

(30) Foreign Application Priority Data

Jun. 15, 2004 (JP) ............................. 2004-177298
Jan. 24, 2005 (JP) ............................. 2005-015569

(51) Int. Cl.
H03H 9/25 (2006.01)
H03H 9/64 (2006.01)
H03H 3/08 (2006.01)

(52) U.S. Cl. ...................... 333/193; 29/25.35; 29/594; 29/609.1; 333/150; 310/313 B

(58) Field of Classification Search ............... 333/193; 29/25.35

See application file for complete search history.

(56) References Cited

U.S. PATENT DOCUMENTS 4,130,771 A * 12/1978 Bottom ..................... 310/312
5,867,074 A * 2/1999 Ogiso et al. ............... 333/193
6,131,257 A * 10/2000 Nishihara et al. .......... 29/25.35

FOREIGN PATENT DOCUMENTS

| JP | 55-143813 | * 11/1980 | ............. 333/193 |
| JP | 4-261207 | * 9/1992 | ............. 333/193 |
| JP | 05-283970 | 10/1993 | |
| JP | 06-164287 | 6/1994 | |
| JP | 8-46474 | * 2/1996 | |
| JP | 10-107569 | * 4/1998 | |
| JP | 2005-57666 | * 3/2005 | |

* cited by examiner

*Primary Examiner*—Barbara Summons
(74) *Attorney, Agent, or Firm*—Harness, Dickey & Pierce, P.L.C.

(57) ABSTRACT

A method for manufacturing a surface acoustic wave element including: forming a conductive film on a surface of a piezoelectric substrate; forming a photoresist film on the conductive film; printing a pattern by exposing and developing the pattern, which is originally provided on a photomask, onto the photoresist film by reduced projection; forming an electrode of a surface acoustic wave element by etching the conductive film using the patterned photoresist film as a mask; measuring a resonant frequency of the surface acoustic wave element formed on the piezoelectric substrate; calculating an anodic oxidation voltage based on an amount of anodic oxidation of the electrode that is calculated in advance from the measured resonant frequency and a preset target resonant frequency; and performing anodic oxidation based on the anodic oxidation voltage calculated in the voltage calculation step and finishing anodic oxidation after detecting an end-point of oxidation reaction of the electrode.

7 Claims, 10 Drawing Sheets

METHOD FOR MANUFACTURING SURFACE ACOUSTIC WAVE ELEMENT, AS WELL AS SURFACE ACOUSTIC WAVE ELEMENT MANUFACTURED BY THE SAME METHOD

RELATED APPLICATIONS

This application claims priority to Japanese Patent Application Nos. 2004-177298 filed Jun. 15, 2004 and 2005-015569 filed Jan. 24, 2005 which are expressly incorporated by reference herein in their entirety.

BACKGROUND OF THE INVENTION

1. Technical Field

The present invention relates to a method for manufacturing a surface acoustic wave element, especially a method for manufacturing a surface acoustic wave element including a step for adjusting the resonant frequency of a surface acoustic wave element formed on a piezoelectric substrate to a target resonant frequency, as well as a surface acoustic wave element that is manufactured by the same manufacturing method.

2. Related Art

With the development of communication technologies in recent years, the frequency of surface acoustic wave (SAW) devices such as SAW resonators, SAW filters, etc. that employ a surface acoustic wave element has become higher. The resonant frequency of a surface acoustic wave element depends on the pitch of a comb-shaped electrode that configures an interdigital transducer (IDT). The comb-shaped electrode has been more miniaturized with the higher frequency of SAW devices. Therefore, the formation of electrodes for a high-frequency surface acoustic wave element has been performed by microprocessing using a reduced projection exposure device (as described in a first related art example, which will be described later). However, the resonant frequency of surface acoustic wave elements cannot be made as accurate as required only by microprocessing electrodes using a reduced projection exposure device due to the influence of thickness variations of the conductive films configuring the electrodes, the fabrication error of the formed electrodes, etc. Hence, in the conventional technique, frequency is adjusted for each surface acoustic wave element so as to obtain a frequency with required accuracy. Further, in a second related art example, which will be described later, a method for adjusting resonant frequency by performing anodic oxidation of comb-shaped electrodes or reflectors while the surface acoustic wave elements are still formed on a wafer (piezoelectric substrate), avoiding the increase of electric resistance due to anodic oxidation of the electrodes performed after cutting the wafer into pieces of surface acoustic wave elements, is disclosed.

Japanese Unexamined Patent Publication No. 5-283970 is the first related art example.

Japanese Unexamined Patent Publication No. 6-164287 is the second related art example.

In the frequency adjustment method according to the second related art example (hereinafter referred to as the conventional frequency adjustment method), however, anodic oxidation is performed by setting an anodic oxidation voltage within the range of several dozen to several hundred volts in accordance with a desired frequency, as described in Paragraph No. 0014 of the second related art example. Therefore, it is difficult to achieve an accurate resonant frequency adjustment. Besides, in the conventional frequency adjustment method, frequency is adjusted with a single attempt of anodic oxidation performed based on an anodic oxidation voltage determined by calculating the amount of frequency adjustment. Therefore, the conventional frequency adjustment method causes a difference in frequency variation due to anodic oxidation, depending on variations among piezoelectric substrates (wafers) in electrode dimensions including the thickness of an electrode film (conductive film), the width of an IDT electrode finger (hereinafter simply referred to as an electrode, occasionally), the pitch of electrode fingers, etc. As a result, in the conventional frequency adjustment method, the variation in resonant frequency among piezoelectric substrates after anodic oxidation, that is, the variation among the average resonant frequencies of surface acoustic wave elements on each piezoelectric substrate becomes large. Therefore, the conventional frequency adjustment method requires further frequency adjustment of each surface acoustic wave element after performing anodic oxidation of electrodes.

SUMMARY

A first advantage of the invention is to provide a method for manufacturing a surface acoustic wave element that causes only a small variation in resonant frequency among surface acoustic wave elements formed on a piezoelectric substrate.

A second advantage of the invention is to provide a method that can adjust the resonant frequency of surface acoustic wave elements formed on a piezoelectric substrate with high accuracy.

A third advantage of the invention is to provide a method that causes only a small variation in resonant frequency among piezoelectric substrates.

A fourth advantage of the invention is to provide a method that can omit a step for adjusting the resonant frequency of each surface acoustic wave element.

According to a first aspect of the invention, a method for manufacturing a surface acoustic wave element includes: a deposition step for forming a conductive film on a surface of a piezoelectric substrate; a photoresist film-forming step for forming a photoresist film on the conductive film; a photoresist film-patterning step for printing a pattern by exposing and developing the pattern, which is originally provided on a photomask, onto the photoresist film by reduced projection; an electrode-forming step for forming an electrode of a surface acoustic wave element by etching the conductive film using the patterned photoresist film as a mask; a frequency measurement step for measuring a resonant frequency of the surface acoustic wave element formed on the piezoelectric substrate; a voltage calculation step for calculating an anodic oxidation voltage based on an amount of anodic oxidation of the electrode that is calculated in advance from the measured resonant frequency and a preset target resonant frequency; and an anodic oxidation step for performing anodic oxidation based on the anodic oxidation voltage calculated in the voltage calculation step and finishing anodic oxidation after detecting an end-point of the oxidation reaction of the electrode.

In the first aspect of the invention, the dimensional variation of the electrodes in the surface acoustic wave elements formed on the piezoelectric substrate becomes smaller than the dimensional variation of the pattern on the photomask by the rate of reduction because the electrode pattern formed on the photomask is exposed by reduced projection. That is, in the case where a pattern on the photomask is exposed by reduced projection using a reduced projection exposure device having an i-ray wavelength of 365 nm with a reduction rate of ⅕, for example, the dimensional variation is reduced to ⅕ of the dimensional variation seen on the photomask. Therefore, the variation in resonant frequency among surface acoustic wave elements formed on a piezoelectric substrate becomes smaller and the accuracy of resonant frequency is improved. Further, in the first aspect of the invention, wherein anodic oxidation for adjusting resonant frequency is finished after detecting the end-point of the oxidation reaction of the electrode, or anodic oxidation, a desired amount of anodic oxidation (an anodic oxide film with a desired film thickness) can surely be obtained, which enables a highly accurate frequency adjustment and makes the variation in resonant frequency among piezoelectric substrates smaller.

It is preferable that the anodic oxidation step is finished at a preset time (i.e., the lapse of a predetermined time period) after the detection of the end-point of oxidation reaction of the electrode. Thus, the variation in end-point detection time caused by disturbances can be avoided, which enables the sure formation of an anodic oxide film having a desired film thickness. Further, it is also preferable that the frequency measurement step, the voltage calculation step, and the anodic oxidation step are repeated a plurality of times. That is, by performing anodic oxidation for adjusting resonant frequency a plurality of separate times, fine frequency adjustment becomes possible and the variation in resonant frequency can be made smaller. Therefore, a resonant frequency adjustment step to be performed after cutting out the pieces of surface acoustic wave elements (chips) formed on a piezoelectric substrate can be omitted, which simplifies the manufacturing process, leading to cost reduction. Consequently, the average of resonant frequencies measured for individual surface acoustic wave elements formed at a plurality of preset positions on the piezoelectric substrate can be used as the measured resonant frequency of the piezoelectric substrate. Thus, a highly accurate resonant frequency adjustment can be achieved.

According to a second aspect of the invention, a surface acoustic wave element is manufactured by the method for manufacturing a surface acoustic wave element described above. Thus, the above-described effect and a highly accurate surface acoustic wave element can be obtained.

BRIEF DESCRIPTION OF THE DRAWINGS

The invention will be described with reference to the accompanying drawings, wherein like numbers refer to like elements, and wherein.

DESCRIPTION OF THE EMBODIMENT

A preferred embodiment of the method for manufacturing a surface acoustic wave element according to the invention and a surface acoustic wave element manufactured by the same method will now be described in detail with reference to the accompanying drawings.

Figure 1:
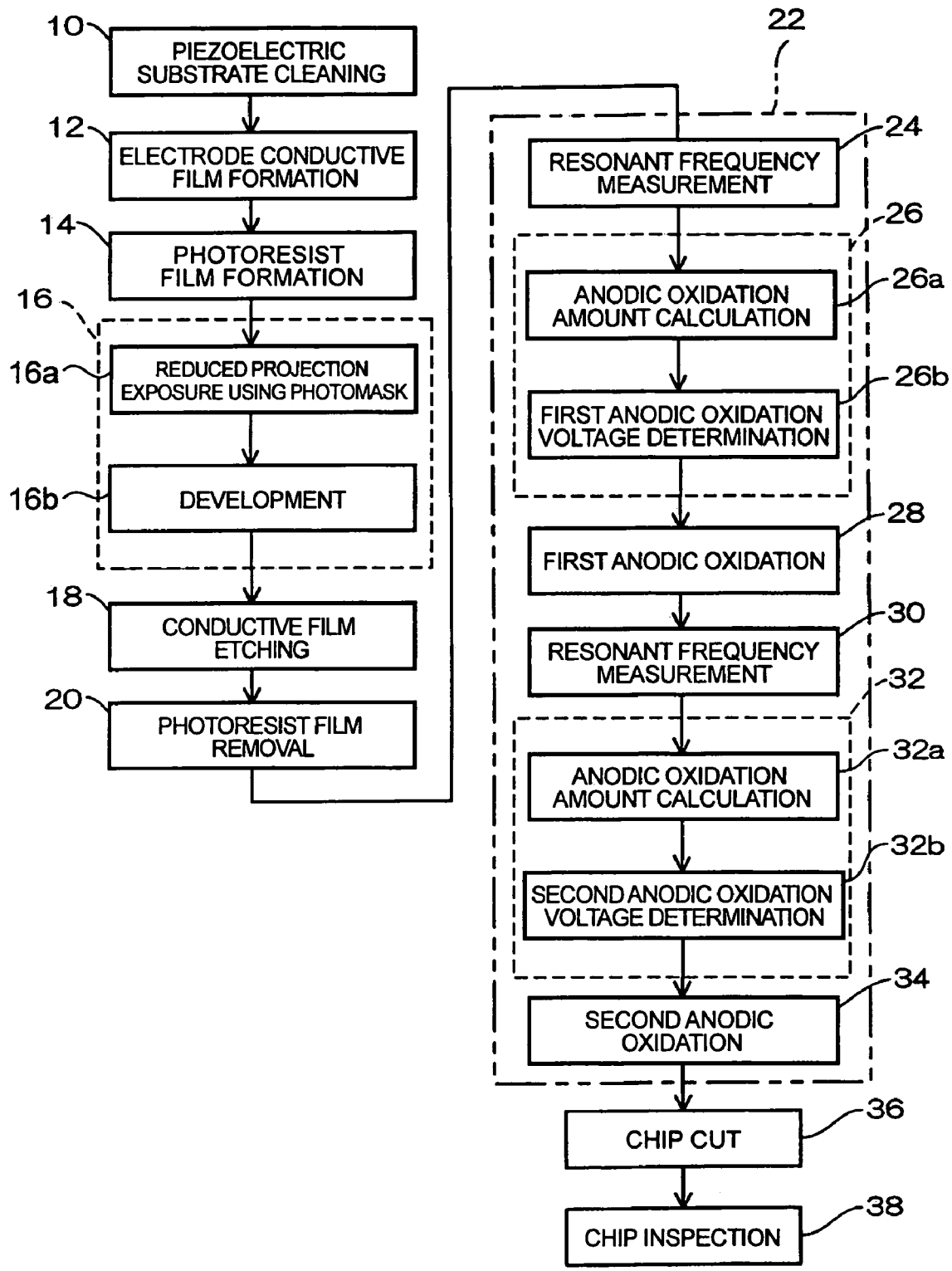
FIG. 1 is a flow chart showing a method for manufacturing a surface acoustic wave element according to an embodiment of the invention.

FIG. 1 is a flow chart showing a method for manufacturing a surface acoustic wave element according to the embodiment of the invention. As shown in step 10 in FIG. 1, a piezoelectric substrate (wafer) made of a piezoelectric material such as quartz, etc. is cleaned. Then, a deposition step (step 12) for forming an electrode-use conductive film made of Al or Al alloy on the surface of the piezoelectric substrate is performed. The variation in film thickness of the electrode-use conductive film (electrode film) needs to be minimized because the variation in film thickness changes the resonant frequency of surface acoustic wave elements. Hence, in the embodiment, the conductive film is deposited by vacuum evaporation. Regarding the conductive film deposited by vacuum evaporation, the film-thickness variation in a single piezoelectric substrate and among a plurality of piezoelectric substrates can be controlled within 1% by setting appropriate conditions for: the distance between a target and the piezoelectric substrate; deposition speed; a film-thickness corrector plate, etc.

Next, a photoresist film-forming step (step 14) for forming a photoresist film by applying a positive photoresist on the conductive film is performed. After that, a photoresist film-patterning step shown as step 16 is performed. The photoresist film-patterning step includes an exposure step 16a and a development step 16b. In the exposure step according to the embodiment, a photomask having a pattern corresponding to the electrode pattern of the surface acoustic wave element is mounted on a reduced projection exposure device; an ultraviolet ray is irradiated onto the photoresist film through the photomask; and the photomask pattern is exposed onto the photoresist film by reduced projection. Thus, the variation in electrode dimensions, such as electrode finger width, electrode finger pitch, etc., of comb-shaped electrodes configuring an IDT can be made smaller than the variation in photomask dimensions. For example, in the case where reduced projection exposure of a photomask pattern is performed using a reduced projection exposure device having an i-ray wavelength of 365 nm with a reduction rate of ⅕, the dimensional variation in the photomask pattern is also reduced to ⅕ when projected onto a photoresist film.

In an exposure operation by a conventional same-size contact or proximity method, the dimensional variation in electrode width and electrode pitch of surface acoustic wave elements having a resonant frequency band of 300 MHz, for example, have been approximately 10%. However, in the embodiment, the dimensional variation in electrode width and electrode pitch of surface acoustic wave elements having a resonant frequency band of 300 MHz can be reduced to 3% or less, if the lens numerical aperture (NA) of the i-ray reduced projection exposure device is 0.55, by setting the exposure size of a single shot to 6-mm² or less.

In addition, in the case of an i-ray reduced projection exposure device, the processing time per wafer is generally shortened by setting the exposure size of one shot to approximately 20-mm², though varied with device performance. However, in the embodiment, the dimensional variation of electrodes is minimized by setting the exposure size of one shot to 6-mm² or less, as described above. Further, it is preferable that the ultraviolet ray used for exposure is irradiated using a light source having an ultraviolet ray within a short wavelength region for the purpose of giving finer dimensional processing. In such a case, the i-ray of 365 nm, the Krf excimer laser of 248 nm, etc. are preferred.

By exposing the photomask pattern onto the photoresist film as described above, the property of the positive photoresist film changes at the region irradiated with the ultraviolet ray to become soluble in a photoresist developing solution. Then, by contacting the surface of the exposed photoresist film to the developing solution, development (step 16b) for printing the photomask pattern onto the photoresist film is performed. Next, following an electrode-forming step (step 18) for etching the conductive film (electrode film) using the patterned photoresist film as a mask, the remaining photoresist film is separated and removed from the piezoelectric substrate (step 20). It is preferable that the etching of the conductive film is performed by plasma dry etching using a reactive gas. In such dry etching, anisotropism can be given to the etching operation. Therefore, by giving anisotropism in the direction of conductive film thickness from the top surface to the boundary surface with the piezoelectric substrate, the conductive film can be etched so that the electrode can be formed with the sides perpendicular to the piezoelectric substrate. With such a method, the processing of the conductive film can be performed in faithful accordance with the electrode pattern printed from the photomask to the photoresist film, which further reduces the variation in electrode dimensions to 3% or less.

Figure 2:
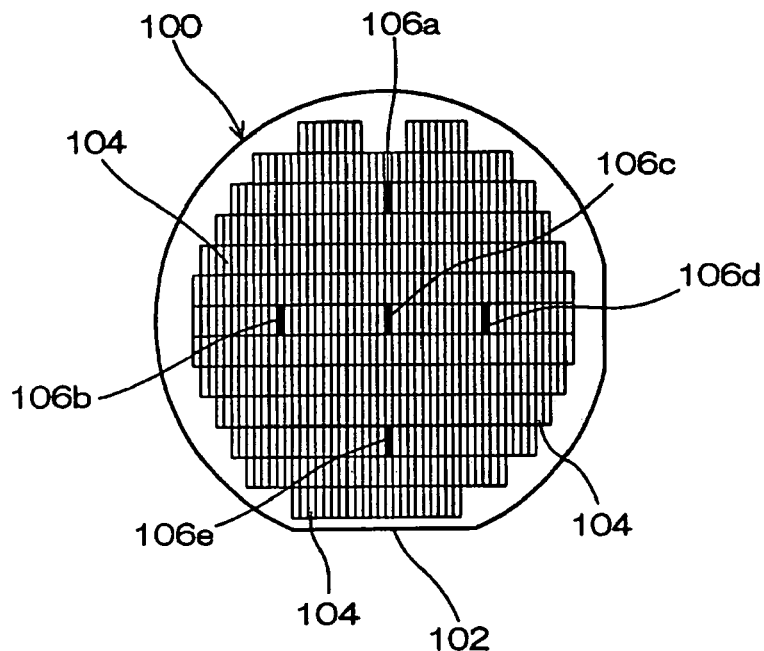
FIG. 2 is a plan view showing an example layout of surface acoustic wave elements formed on a piezoelectric substrate.

Thus, the conductive film made of Al or Al alloy on the piezoelectric substrate is patterned and surface acoustic wave elements are formed on the piezoelectric substrate. FIG. 2 is an example of the layout pattern of surface acoustic wave elements formed on a piezoelectric substrate. In FIG. 2, a piezoelectric substrate 100, which is made of quartz, is cut out of a quartz block at a specific cutting angle and has an orientation flat 102 for the purpose of positioning. Further, each of the rectangles shown in FIG. 2 corresponds to a surface acoustic wave element 104 having an IDT and reflectors. In addition, surface acoustic wave elements 106 (106a to 106e) shown in black in FIG. 2 are measurement-use surface acoustic wave elements for calculating the average of resonant frequencies of a number of surface acoustic wave elements 104. In the embodiment, there are five measurement-use surface acoustic wave elements 106. The measurement-use surface acoustic wave elements 106, each of which is formed at a pre-specified position, are provided at the center of the piezoelectric substrate 100 and four positions: top, bottom, left, and right, almost symmetrically with reference to the center.

Figure 3:
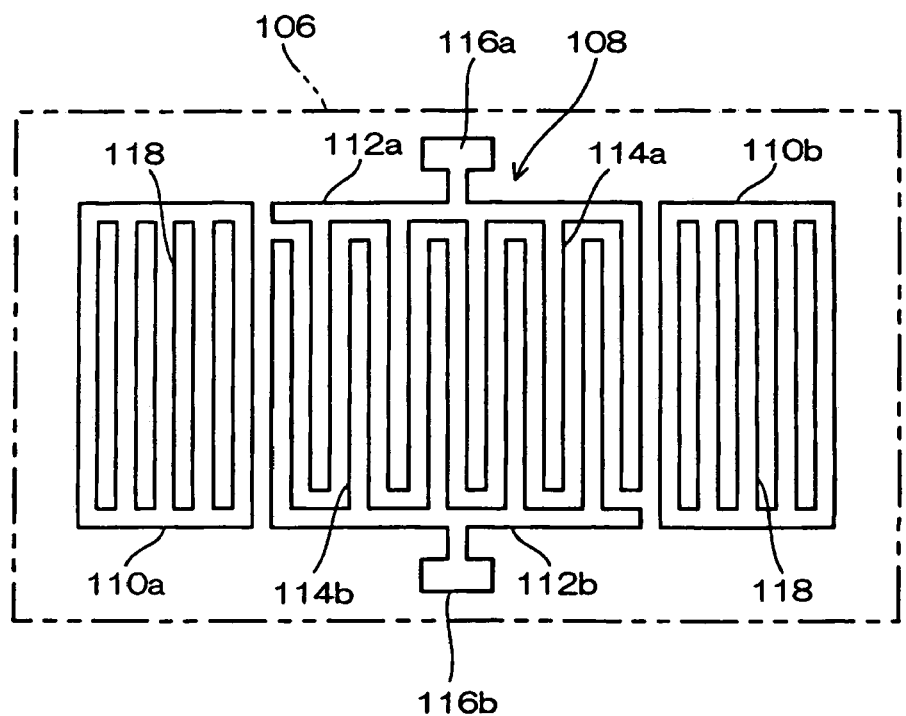
FIG. 3 is a detailed explanatory diagram of a measurement-use surface acoustic wave element according to the embodiment of the invention.

The measurement-use surface acoustic wave element 106 has an IDT 108 made of a conductive film and reflectors 110 (110a and 110b) provided on both sides of the IDT 108, as shown in FIG. 3. The IDT 108 is configured of a pair of comb-shaped electrodes 112 (112a and 112b). Further, the comb-shaped electrodes 112 are placed with their electrode fingers 114 (114a and 114b) alternately staggered with each other. Furthermore, each of the comb-shaped electrodes 112 has a pad 116 (116a or 116b) for contacting a probe (not illustrated) of a frequency measuring instrument. On the other hand, the reflectors 110a and 110b, which have the same lattice-shaped configuration, are formed of a plurality of conductor strips 118 that are coupled to one another at both ends.

In addition, (and as with the measurement-use surface acoustic wave element 106) each of the other surface acoustic wave elements 104 also has the IDT 108, which is configured of a pair of the comb-shaped electrodes 112, and a pair of the reflectors 110. Further, the surface acoustic wave elements 104 are divided into a plurality of blocks, wherein both group of the comb-shaped electrodes 112a and 112b in the same block are coupled together to a common electrode via the pad 116, etc. Also, reflectors 110 are coupled in the same manner so that a voltage can be applied simultaneously via the common electrode. In addition, the measurement-use surface acoustic wave elements 106 are coupled via the common electrode in the same manner.

Assuming the propagation velocity of surface acoustic wave as v and the wavelength of surface acoustic wave as λ, the resonant frequency f of the surface acoustic wave element that is obtained in the above-described method can be defined in an expression 1: f=v/λ.

Further, the wavelength λ of surface acoustic wave of the surface acoustic wave element 104 basically depends on the design of electrode patterns including the pitch of the electrode fingers 114 of the comb-shaped electrodes configuring the IDT. Therefore, it is difficult to adjust the resonant frequency of surface acoustic wave elements by changing the wavelength λ under various electrode pattern pitches, etc., during the manufacturing process.

On the other hand, the propagation velocity v of the surface acoustic wave is originally determined by the material of the piezoelectric substrate that configures the surface acoustic wave elements 104. However, the propagation velocity v depends on the mass of the comb-shaped electrodes 114: the larger the mass is, the slower the velocity becomes. That is, regarding the surface acoustic wave elements, the propagation velocity v of the surface acoustic wave can be changed by changing the mass of the electrodes, including the thickness of the electrodes for example, which further makes it possible to change (adjust) the resonant frequency f, as shown in the expression 1. Further, when anodic oxidation is performed for the Al electrodes of the surface acoustic wave elements, the effect of mass addition caused by the bonding of Al with oxygen atoms can be obtained and adjustment for reducing resonant frequency becomes possible.

Thus, in the embodiment, a resonant frequency adjustment step shown as step 22 is performed for the piezoelectric substrate 100 on which the surface acoustic wave elements 104 and the measurement-use surface acoustic wave elements 106 are formed. In the resonant frequency adjustment step according to the embodiment, anodic oxidation is performed two separate times. In the resonant frequency adjustment step, a first frequency measurement step, shown as step 24, for measuring the resonant frequency of the measurement-use surface acoustic wave elements 106 is performed. Then, a first voltage calculation step shown as step 26 is performed. The voltage calculation step includes an anodic oxidation amount calculation step shown as step 26a and a first anodic oxidation voltage determination step shown as step 26b.

Figure 4:
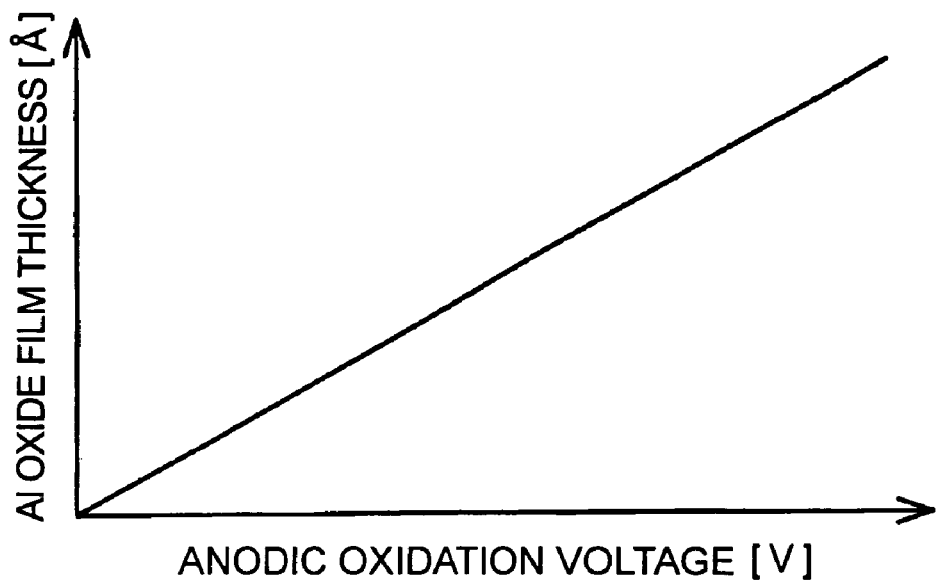
FIG. 4 is a diagram showing the relation between anodic oxidation voltage and anodic oxide film thickness.

In the anodic oxidation amount calculation step, the average of the measured resonant frequencies (the average resonant frequency) of the measurement-use surface acoustic wave elements 106a to 106e is calculated. Then, based on the difference between the average resonant frequency and a preset target resonant frequency, the amount of anodic oxidation (the thickness of the anodic oxide film) of the comb-shaped electrodes 112 and the reflectors 110 that configure the IDT 108 is calculated. Further, based on the calculated thickness, an anodic oxidation voltage is determined. There is a relation shown in FIG. 4 between the anodic oxidation voltage and the thickness of the Al anodic oxide film. That is, the anodic oxidation voltage is in proportion to the thickness of the anodic oxide film. Further, in the case where an electrolytic solution used for anodic oxidation is ammonium phosphate, an anodic oxide film with a thickness of 13 angstrom per anodic oxidation voltage can be formed.

Figure 5:
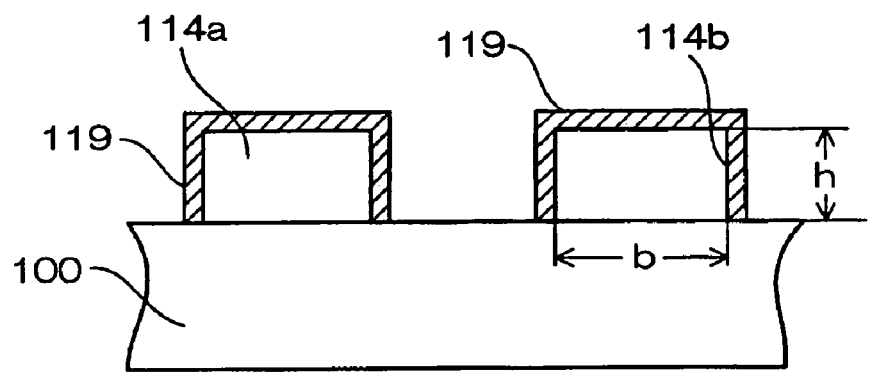
FIG. 5 is a partial cross section of a comb-shaped electrode.
Figure 6:
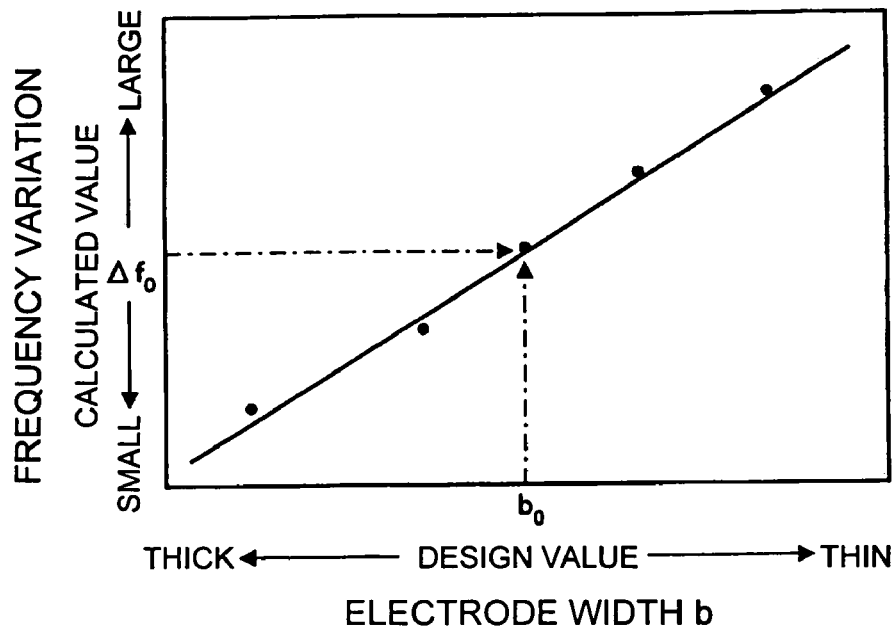
FIG. 6 is a diagram showing the relation between electrode width and frequency variation caused by anodic oxidation.
Figure 7:
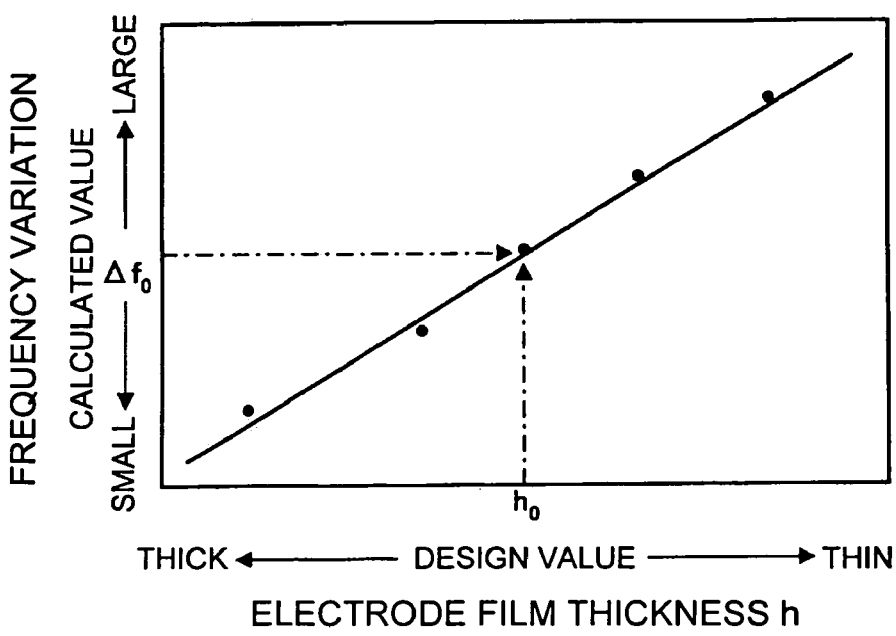
FIG. 7 is a diagram showing the relation between electrode film thickness and frequency variation caused by anodic oxidation.

Further, when anodic oxidation of the electrode fingers (electrodes) 114 made of Al is performed, the surface region of each electrode 114 that contacts with the electrolytic solution (anodic oxidation solution) is entirely subjected to anodic oxidation. Therefore, when anodic oxidation of the electrodes 114 is performed, an anodic oxide film 119 is formed on the top and sides of each electrode 114 as shown in a partial cross section in FIG. 5, and the resonant frequency of the surface acoustic wave elements changes as shown in FIGS. 6 and 7. FIG. 6 shows the relation between a width b of the electrodes 114 and the resonant frequency variation caused by anodic oxidation, with the horizontal axis representing the electrode width b and the vertical axis representing the frequency variation. In addition, FIG. 7 shows the relation between an electrode film thickness h and the resonant frequency variation caused by anodic oxidation.

As shown in FIG. 6, in the case where the anodic oxide film 119 of a certain thickness t is formed on the electrodes 114 by anodic oxidation with the electrode width b set to $b_o$ as per the designed dimension (design value), a frequency variation $\Delta f_o$ as per the calculated value can be obtained. However, in the case where the anodic oxide film 119 of the same thickness as above is formed with the electrode width b set to a value larger (thicker) than the design value, the frequency variation becomes smaller. In contrast, when the electrode width b is thinner than the design value, the frequency variation becomes larger. Further as shown in FIG. 7, when the electrode film thickness (the thickness of the conductive film) h is set to $h_o$ as per the design value, a frequency variation $\Delta f_o$ as per the calculated value can be obtained. However, when the electrode film thickness h is thicker than the design value, the frequency variation becomes smaller even when the thickness of the anodic oxide film 119 is the same. In contrast, when the electrode film thickness h is thinner than the design value, the frequency variation becomes larger.

Therefore, by calculating or experimenting in advance how much the resonant frequency of surface acoustic wave elements decreases when the anodic oxide film 119 is formed with a thickness of 10 angstrom or 100 angstrom on the electrodes 114, the anodic oxidation amount (the thickness of the anodic oxide film 119) of the comb-shaped electrodes 112 and the reflectors 110 is calculated based on the difference between the average resonant frequency and the target resonant frequency. Then, the first anodic oxidation voltage determination shown as the step 26b is performed.

In the embodiment, anodic oxidation is performed two separate times. Therefore, the first anodic oxidation voltage is set so that the anodic oxide film 119 is formed with a thickness of 80 to 95% of the thickness calculated above. For example, in the case where the anodic oxidation voltage required for adjusting the average resonant frequency to the target resonant frequency is 80 V, the first anodic oxidation voltage is set to 64 to 76 V. Here, an electric current (current density) to be used for anodic oxidation is determined as well. After the anodic oxidation voltage is calculated, a first anodic oxidation step (step 28 in FIG. 1) is performed using an anodic oxidation device 120 shown in FIG. 8

The anodic oxidation device 120 has a constant-voltage power supply 122 and an anodic oxidation tank 124. The constant-voltage power supply 122 can set not only a voltage value but also a current value to be applied to the anodic oxidation tank 124. The anodic oxidation tank 124, which has a capacity allowing a wafer rack 126 containing a plurality of the piezoelectric substrates 100, retains an electrolytic solution 128, such as an ammonium phosphate solution, etc., inside. The comb-shaped electrodes 112 and the reflectors 110 of the surface acoustic wave elements formed on the piezoelectric substrate 100 are coupled to the positive (+) terminal of the constant-voltage power supply 122 via a conductive clip 130. Further, a counter electrode 132 is provided in the electrolytic solution 128 in the anodic oxidation tank 124. The counter electrode 132 is coupled to the negative (−) terminal of the constant-voltage power supply 122.

On the wire coupling the constant-voltage power supply 122 and the conductive clip 130, a current detector 134 is provided. The current detector 134, which is coupled to an end-point detection unit 138 of an oxidation end-point detection unit 136, inputs a detection signal into the end-point detection unit 138. The oxidation end-point detection unit 136 has an end-point detection current setting unit 140 and a timer 142, in addition to the end-point detection unit 138. The end-point detection unit 138 compares the detection signal of the current detector 134 with an end-point detection current that is set in the end-point detection current setting unit; detects the end-point of oxidation reaction of the comb-shaped electrodes provided on the surface acoustic wave elements, that is, the end-point of anodic oxidation; and starts the timer 142. Then, after the timer 142 finishes the measurement of a specified time, the end-point detection unit 138 turns off the constant-voltage power supply 122 and, at the same time, resets the timer 142.

When the first anodic oxidation by the anodic oxidation device 120 is finished, a second resonant frequency measurement step (step 30) for measuring the resonant frequency of the measurement-use surface acoustic wave elements 106 that are through anodic oxidation is performed for the purpose of performing a second anodic oxidation. Next, a second voltage calculation step (step 32) is performed. The second voltage calculation step 32 includes, like the first voltage calculation step 26, a second anodic oxidation amount calculation step 32a and a second anodic oxidation voltage determination step 32b. In the second anodic oxidation amount calculation step 32a, like the first anodic oxidation amount calculation step 26a, the anodic oxidation amount (the thickness of the anodic oxide film 119) for adjusting the average resonant frequency to the target resonant frequency is calculated. Further, the sum of the calculated thickness of the anodic oxide film and the thickness of the anodic oxide film formed in the first anodic oxidation is calculated, which is defined as the anodic oxidation amount required for frequency adjustment. Then, in the second anodic oxidation voltage determination step 32b, an anodic oxidation voltage (81 V, for example) that can form the required anodic oxide film thickness calculated in the second anodic oxidation amount calculation step 32a is directly set as the second anodic oxidation voltage. Also in this case, an oxidation current is determined as well.

Then, the second anodic oxidation shown as step 34 is performed. In the second anodic oxidation, like the first anodic oxidation, anodic oxidation is continued until when a specified time elapses after detecting the end-point of oxidation reaction of the electrodes. With the completion of the second anodic oxidation, the resonant frequency adjustment step for the surface acoustic wave elements formed on the piezoelectric substrate 100 is completed. Next, the piezoelectric substrate 100 is cut into pieces of individual surface acoustic wave elements (chips) (step 36). Further, the surface acoustic wave elements are inspected (step 38) and forwarded to the next step.

Figure 8:
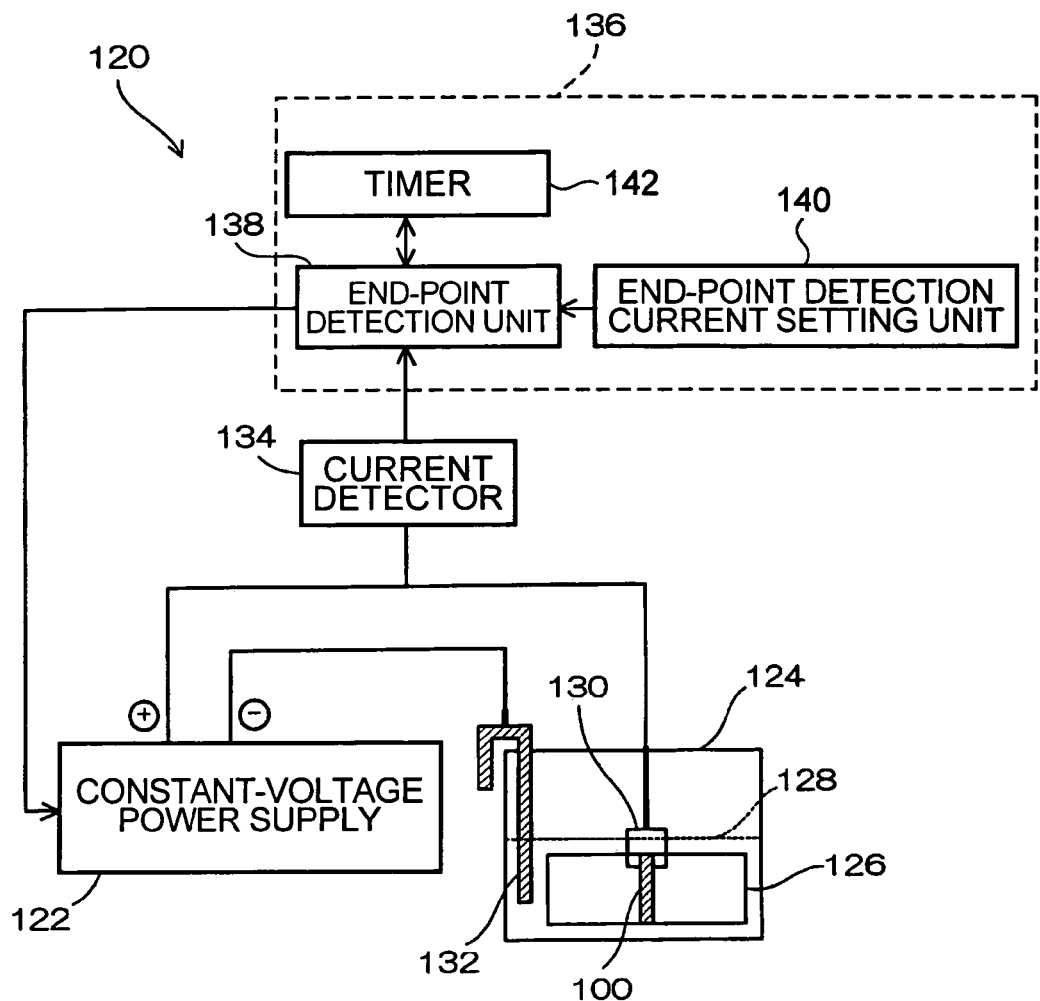
FIG. 8 is an explanatory diagram of an anodic oxidation device according to the embodiment of the invention.
Figure 9:
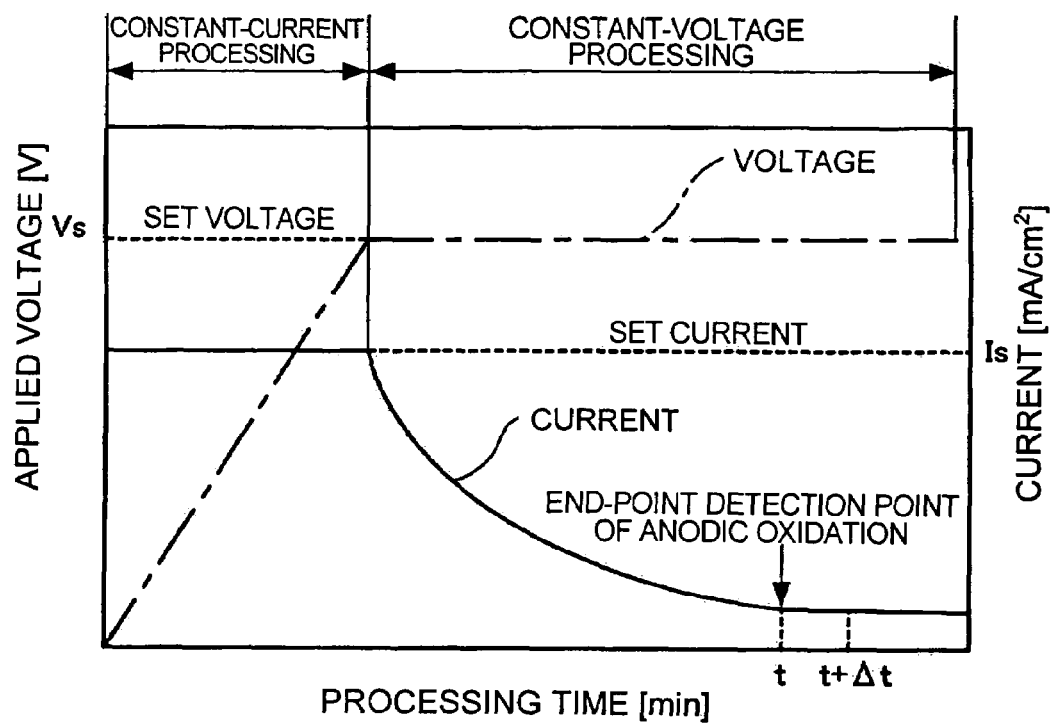
FIG. 9 is an explanatory diagram of an anodic oxidation method according to the embodiment of the invention.

Anodic oxidation by the anodic oxidation device 120 shown in FIG. 8 is performed as follows. As shown in FIG. 8, the comb-shaped electrodes 112 and the reflectors 110 of the surface acoustic wave elements are coupled to the positive terminal of the constant-voltage power supply 122, and the counter electrode 132 is coupled to the negative terminal of the constant-voltage power supply 122. Further, as shown in FIG. 9, an anodic oxidation voltage Vs as a current (current density mA/cm$^2$) Is used for anodic oxidation is set in the constant-voltage power supply 122. Then, by turning on the switch of the constant-voltage power supply 122, the set current Is runs among the comb-shaped electrodes 112, the reflectors 110, and the counter electrode 132 via the electrolytic solution 128 to start anodic oxidation.

Since the resistance of the electrodes formed on the piezoelectric substrate 100 is small immediately after the start of anodic oxidation, constant-current processing at the set current Is is performed. With the progress of anodic oxidation, an anodic oxide film is formed on the comb-shaped electrodes, which causes an increase of the electric resistance of the comb-shaped electrodes, as well as a gradual increase of the applied voltage to reach the set voltage Vs, followed by constant-voltage processing. When the applied voltage reaches the set voltage Vs, the current value starts to decrease due to the increase of the resistance of the comb-shaped electrodes. The current (current density) to be supplied to the wafer is detected by the current detector 134 and inputted into the end-point detection unit 138 of the oxidation end-point detection unit 136.

The end-point detection unit 138 compares the detection signal outputted by the current detector 134 with the end-point detection current (current density) that is set in the end-point detection current setting unit 140. Then, when the value of the current detector 134 that is detected at the lapse of a time t from the start of anodic oxidation becomes smaller than the set value, 10 µA/cm$^2$ for example, the end-point detection unit 138 regards that the oxidation reaction of the comb-shaped electrodes 112 has reached the end-point and inputs a start signal into the timer 142. Thus, the timer 142 starts to measure a preset time Δt, 60 seconds for example. Then, at the completion of the measurement of the preset time Δt by the timer 142, the end-point detection unit 138 turns off the constant-voltage power supply 122 to stop anodic oxidation and resets the timer 142.

As described above, in the embodiment, since an electrode pattern is formed using a mask configured of a photoresist film patterned by reduced projection exposure and since anodic oxidation for adjusting resonant frequency is finished after the end-point of oxidation reaction of electrodes is detected, the variation in resonant frequency among piezoelectric substrates (the average resonant frequencies of surface acoustic wave elements on individual piezoelectric substrates) can be made smaller. Further, in the embodiment, since anodic oxidation is finished after the end-point of oxidation reaction of electrodes is detected, an anodic oxide film of a desired thickness can surely be formed and highly accurate resonant frequency adjustment can be achieved. Furthermore, since anodic oxidation is continued even after detecting the end-point of oxidation reaction of electrodes, or anodic oxidation, for a specific period of time, anodic oxidation can surely be performed until the end-point even if the detection current temporarily drops below the end-point detection current value due to disturbances, etc. In addition, in the embodiment, since anodic oxidation for adjusting the resonant frequency of surface acoustic wave elements is performed two separate times, fine frequency adjustment with reference to the target frequency is possible, which reduces the variation in the average resonant frequency of surface acoustic wave elements among a plurality of wafers.

Figure 10:
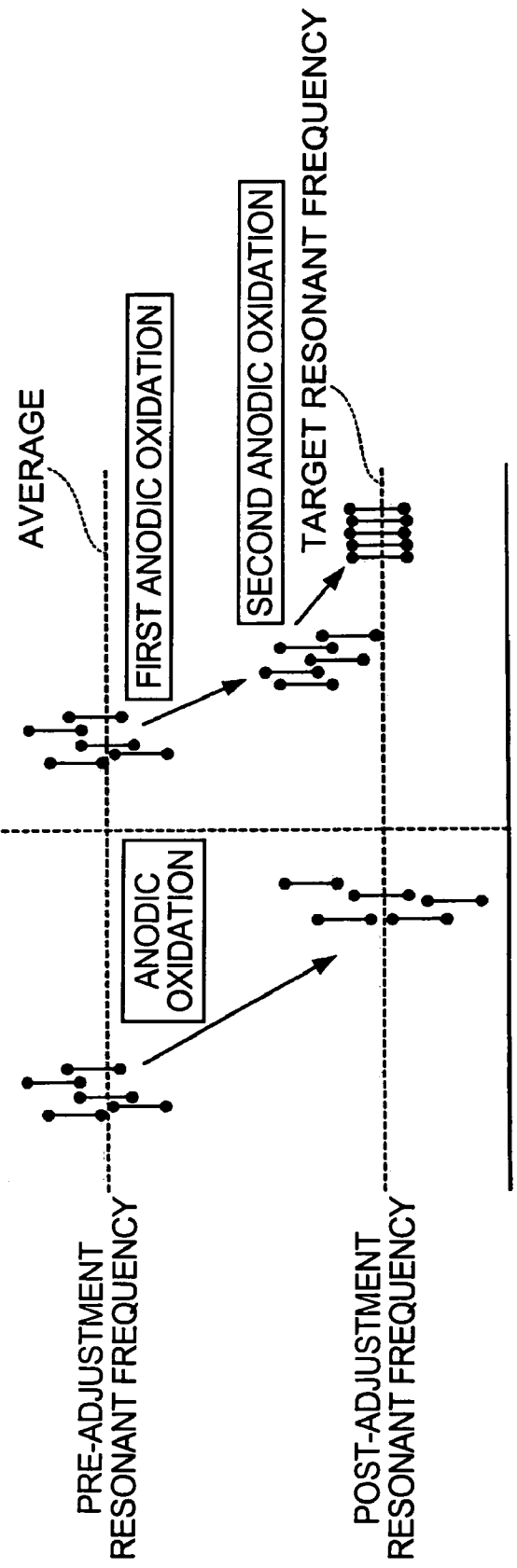
FIG. 10 is a comparative chart of a conventional resonant frequency adjustment method and a resonant frequency adjustment method according to the embodiment of the invention.
Figure 11:
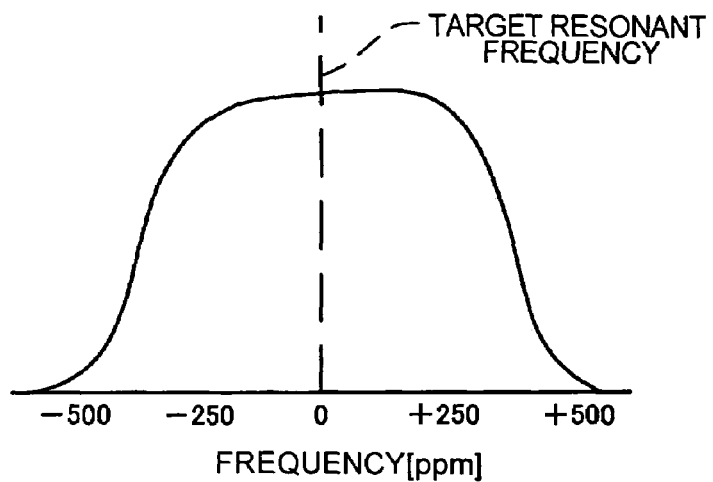
FIG. 11 is a chart of resonant frequency variations among piezoelectric substrates after resonant frequency adjustment in the conventional method and the embodiment of the invention.
Figure 11:
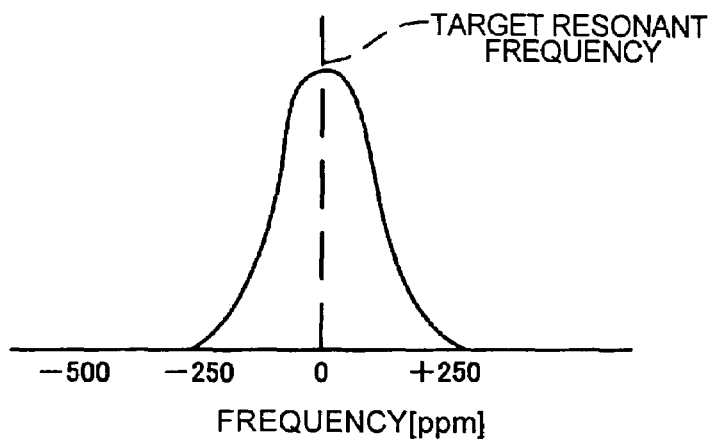
Figure 11:
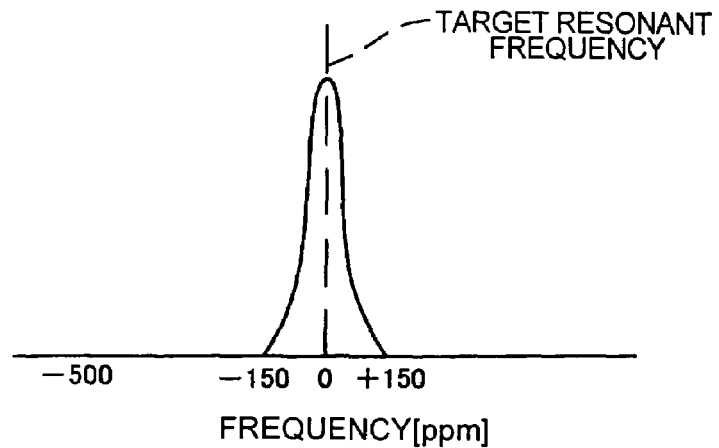

That is, as shown in FIG. 10 (1), the measured resonant frequency has conventionally been adjusted to the target resonant frequency in a single anodic oxidation. Therefore, the conventional technique has caused a large variation in resonant frequency among post-adjustment wafers due to dimensional errors of electrode film thickness, electrode size, etc. among wafers. As shown in FIG. 11 (1), the frequency variation in the conventional technique almost ranges ±500 ppm with reference to the target resonant frequency. On the other hand, in the embodiment, anodic oxidation is performed two separate times, as shown in FIG. 10 (2). Therefore, the embodiment can achieve fine resonant frequency adjustment taking into account the variation in conductive film thickness and electrode dimension among a plurality of piezoelectric substrates. Thus, the variation in resonant frequency among wafers after anodic oxidation can be reduced.

That is, in the embodiment, since electrode patterns are formed by reduced projection exposure, the variation in electrode dimension of surface acoustic wave elements formed on the piezoelectric substrate can be reduced in the first anodic oxidation to a level where the difference between the average resonant frequency and the target resonant frequency becomes within approximately ±250 ppm, as shown in FIG. 11 (2). Further, by performing resonant frequency adjustment based on the second anodic oxidation, which adds another fine frequency adjustment, the resonant frequency variation with reference to the target frequency can be controlled to approximately 150 ppm, as shown in FIG. 11 (3). Therefore, in the embodiment, a step for adjusting the resonant frequency of each surface acoustic wave element, which is to be performed after cutting the piezoelectric substrate 100 into pieces of individual surface acoustic wave elements 104, can be omitted. Hence, in the embodiment, the manufacturing process can be simplified, enabling the direct application of the surface acoustic wave elements that are cut out of the piezoelectric substrate to SAW devices for short-distance communication systems such as keyless entry systems, IC tag systems, etc. Further, in the embodiment, wherein the resonant frequency of the surface acoustic wave elements formed on the piezoelectric substrate is directly measured, an accurate adjustment amount (frequency) of the resonant frequency can be calculated, and thus a highly accurate frequency adjustment can be achieved.

Figure 12:
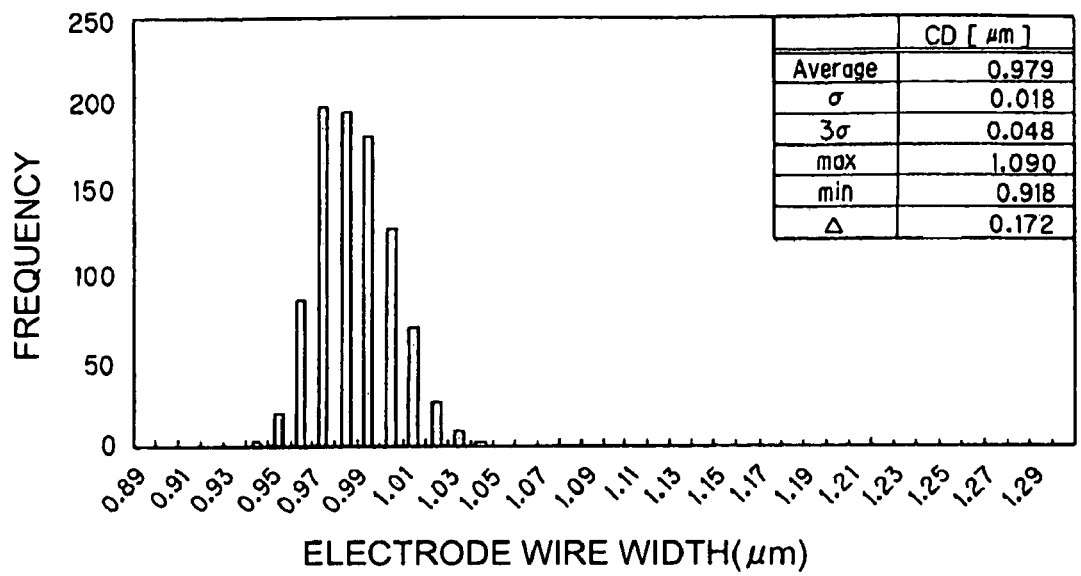
FIG. 12 is a frequency distribution chart of electrode finger widths of surface acoustic wave elements manufactured by the method according to the embodiment of the invention.
Figure 13:
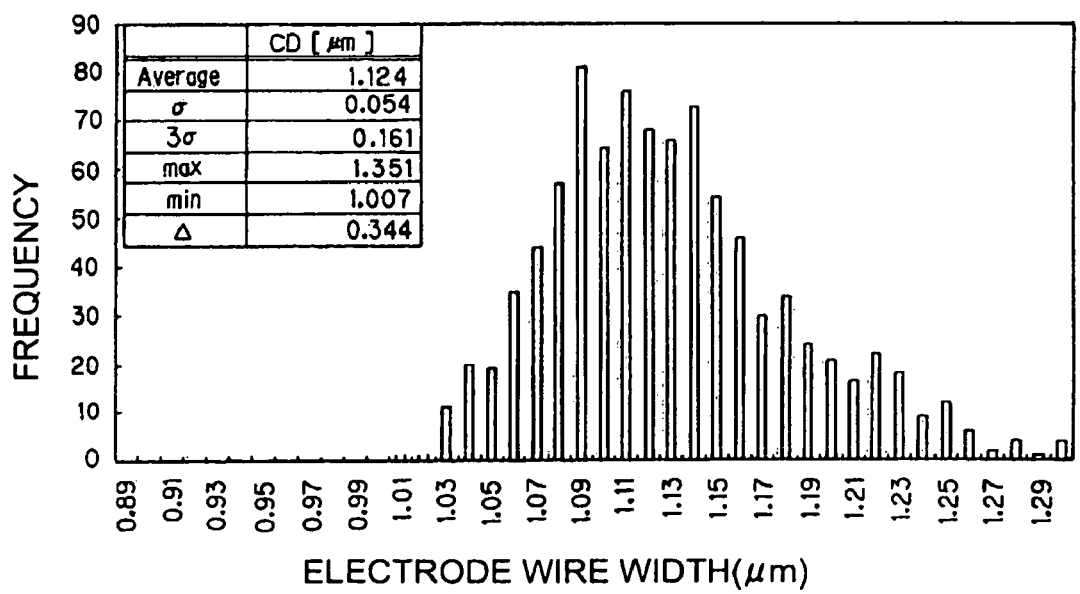
FIG. 13 is a frequency distribution chart of electrode finger widths of surface acoustic wave elements manufactured by the conventional method.

For the purpose of confirming the advantageous effects according to the embodiment of the invention, the inventors has performed a comparative experiment of the surface acoustic wave element-manufacturing method according to the embodiment of the invention and the conventional surface acoustic wave element-manufacturing method. FIGS. 12 and 13 are frequency distribution charts for comparing critical dimensions (CD) of the width of the electrode fingers configuring an IDT. FIG. 12, which is based on the manufacturing method according to the embodiment of the invention, shows a case where the IDT is formed by dry etching after printing a pattern of a photomask onto a photoresist film with a reduction rate of ⅕ using a reduced projection exposure device. On the other hand, FIG. 13, which is based on the conventional manufacturing method, shows a case where the IDT is formed by dry etching after printing the pattern of the same photomask that is subjected to reduced projection exposure in the above case onto a photoresist film by same-size contact exposure using an aligner. In both FIGS. 12 and 13, the horizontal axis represents the width of electrode fingers (electrode wire width) configuring the IDT and expressed in μm, and the vertical axis represents the frequency. Further, both FIGS. 12 and 13 show the case where surface acoustic wave elements are formed by performing batch processing of a plurality of quartz wafers and the electrode wire width is measured for surface acoustic wave elements that are randomly selected from a number of the formed surface acoustic wave elements. In addition, the target value (design value) of electrode wire width is 1.033 μm.

As shown in FIG. 12, when the reduced projection exposure device in the embodiment of the invention is used, the difference Δ between the maximum and minimum values of electrode wire width is 0.172 μm and 3σ is 0.048 μm. On the other hand, in the case of the conventional same-size contact exposure using an aligner, the difference Δ between the maximum and minimum values of electrode wire width is 0.344 μm and 3σ is 0.161 μm. Hence, in the surface acoustic wave element-manufacturing method according to the embodiment of the invention using a reduced projection exposure device, 3σ of the electrode wire width can be set to approximately 0.5 μm. To put it the other way around, when 3σ of the measured electrode wire width is approximately 0.5 μm, it is assumed that the IDT is formed by photoetching using a reduced projection exposure device.

Figure 14:
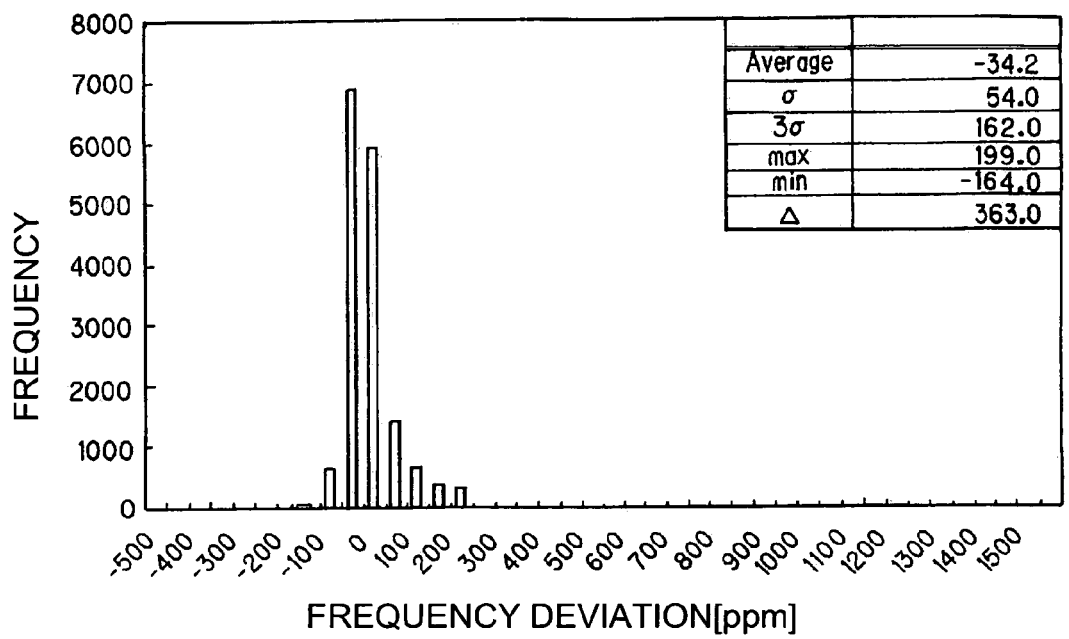
FIG. 14 is a frequency distribution chart of frequency deviations after frequency adjustment of surface acoustic wave elements manufactured by the method according to the embodiment of the invention.
Figure 15:
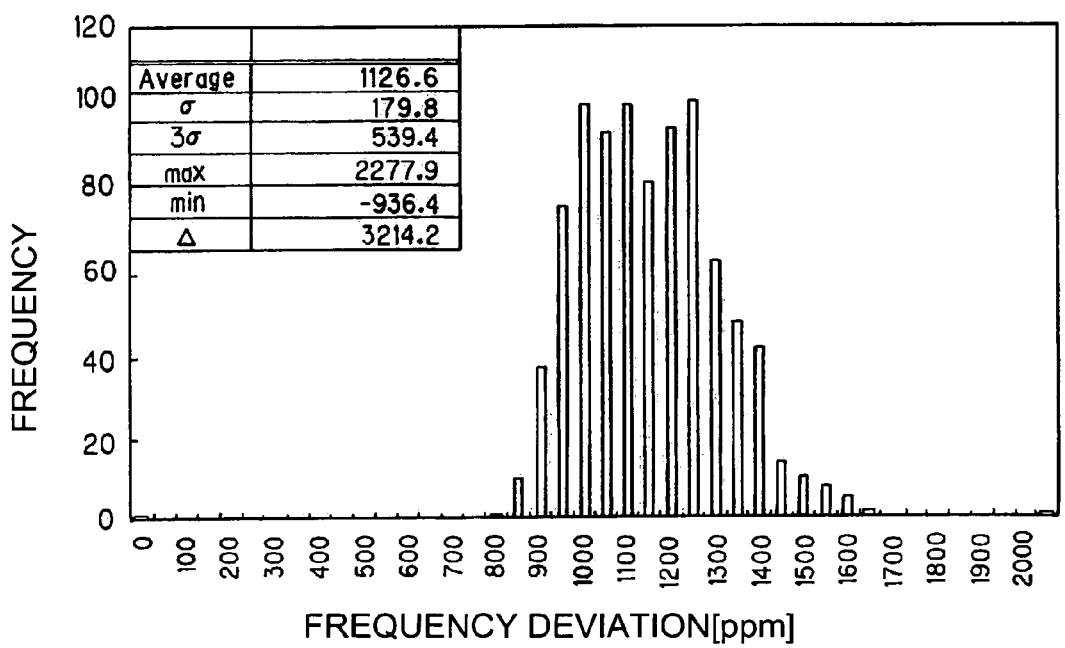
FIG. 15 is a frequency distribution chart of frequency deviations after frequency adjustment of surface acoustic wave elements manufactured by the conventional method.

FIGS. 14 and 15 are frequency distribution charts showing the variation in resonant frequency after frequency adjustment regarding the surface acoustic wave elements manufactured with the method according to the embodiment of the invention and the surface acoustic wave elements manufactured with the conventional method. FIG. 14, which is based on the case of surface acoustic wave elements having an IDT that is formed using a reduced projection exposure device, shows the variation in resonant frequency after adjusting frequency by performing anodic oxidation of the IDT two separate times in the state of a wafer. On the other hand, FIG. 15 shows the variation in resonant frequency after adjusting frequency employing the wet method as in the conventional method, wherein an IDT is formed by same-size contact exposure using the conventional aligner. In both FIGS. 14 and 15, the horizontal axis represents the deviation of the resonant frequency from the target resonant frequency (indicated as 0) expressed in ppm, and the vertical axis represents the frequency. In addition, the manufactured surface acoustic wave elements have a band of 300 MHz. Further, FIGS. 14 and 15 are both the measurement results of surface acoustic wave elements randomly selected from a number of surface acoustic wave elements formed by batch processing of a plurality of quartz wafers.

As shown in FIG. 14, when frequency adjustment is performed by anodic oxidation of the IDT after forming the IDT using a reduced projection exposure device, the variation in resonant frequency can be made very small. In the case of surface acoustic wave elements having a band of 300 MHz, for example, the 3σ deviation with reference to the target resonant frequency can be set to approximately 160 ppm. Therefore, there is no need to perform frequency adjustment after cutting the substrate into pieces of surface acoustic wave elements. In contrast, when frequency adjustment is performed by the wet method after forming the IDT by the conventional same-size contact exposure using the conventional aligner, the 3σ deviation of the resonant frequency of surface acoustic wave elements having 300 MHz with reference to the target resonant frequency becomes approximately 540 ppm. This means that surface acoustic wave elements manufactured in the conventional method contains many out-of-specification products. Regarding surface acoustic wave elements manufactured by the conventional method, the 3σ deviation of the resonant frequency with reference to the target frequency can be made 150 ppm by excluding out-of-specification products before shipping as products. However, if such selected surface acoustic wave elements manufactured by the conventional method are shipped, the distribution of frequency deviations of the surface acoustic wave elements shipped as products is supposed to be apparently different from the distribution shown in FIG. 14. Therefore, by comparing the distribution of resonant frequencies or deviations with reference to the target resonant frequency regarding a plurality of surface acoustic wave elements, the judgment of whether or not the products are manufactured by the method according to the embodiment of the invention can be made, which also applies to the above-described distribution of electrode wire widths.

By the way, in the case where an IDT is formed by same-size contact exposure using the conventional aligner, the variation in electrode wire width becomes larger as shown in FIG. 13, and the variation in resonant frequency also becomes larger. Then, performing frequency adjustment by anodic oxidation of the IDT can be considered so as to control the variation in resonant frequency. When frequency adjustment is performed by anodic oxidation of the IDT, the pre-adjustment resonant frequency is set to a little higher than the target resonant frequency. This is because, as described above, resonant frequency decreases by performing anodic oxidation of the IDT. Further, in the frequency adjustment performed by anodic oxidation of the IDT, when the resonant frequency of surface acoustic wave elements is slightly higher than the target resonant frequency, the decrease in resonant frequency is lessened by forming a thinner anodic oxide film. Alternatively, when the resonant frequency is considerably higher than the target resonant frequency, the decrease in resonant frequency is enlarged by forming a thicker anodic oxide film. That is, in the frequency adjustment by anodic oxidation of the IDT, the variation in thickness of the anodic oxide film depends on the variation in resonant frequency and electrode wire width before frequency adjustment. Therefore, by calculating the variation in thickness of the anodic oxide film, the judgment of whether the IDT is formed using a reduced projection exposure device or by same-size contact exposure using an aligner can be made.

In addition, the resonant frequency adjustment by anodic oxidation, which is performed two times in the embodiment, can be performed three times or more. Further, the piezoelectric material, which is quartz in the embodiment, can also be lithium niobate, lithium tantalate, etc. Furthermore, the electrolytic solution to be used for anodic oxidation, which is ammonium phosphate in the embodiment, can also be other electrolytic solutions only if available for anodic oxidation.

What is claimed is:

1. A method for manufacturing a surface acoustic wave element, comprising the steps of:
    forming a conductive film on a surface of a piezoelectric substrate;
    forming a photoresist film on the conductive film;
    printing a pattern by exposing and developing the pattern, which is originally provided on a photomask, onto the photoresist film by reduced projection;
    forming an electrode of a surface acoustic wave element by etching the conductive film using the patterned photoresist film as a mask;
    measuring a resonant frequency of the surface acoustic wave element formed on the piezoelectric substrate;
    calculating an anodic oxidation voltage based on an amount of anodic oxidation of the electrode that is calculated in advance from the measured resonant frequency and a preset target resonant frequency; and
    performing anodic oxidation based on the anodic oxidation voltage calculated in the voltage calculation step and finishing anodic oxidation after detecting an end-point of oxidation reaction of the electrode,
    wherein the anodic oxidation step is finished at a preset time after detecting the end-point.

2. A surface acoustic wave element that is manufactured by the method for manufacturing a surface acoustic wave element according to claim 1.

3. The method for manufacturing a surface acoustic wave element according to claim 1, wherein the frequency measurement step, the voltage calculation step, and the anodic oxidation step are repeated a plurality of times.

4. A method for manufacturing a surface acoustic wave element, comprising the steps of:
    forming a conductive film on a surface of a piezoelectric substrate;
    forming a photoresist film on the conductive film;
    printing a pattern by exposing and developing the pattern, which is originally provided on a photomask, onto the photoresist film by reduced projection;
    forming an electrode of a surface acoustic wave element by etching the conductive film using the patterned photoresist film as a mask;
    measuring a resonant frequency of the surface acoustic wave element formed on the piezoelectric substrate;
    calculating an anodic oxidation voltage based on an amount of anodic oxidation of the electrode that is calculated in advance from the measured resonant frequency and a preset target resonant frequency; and
    performing anodic oxidation based on the anodic oxidation voltage calculated in the voltage calculation step and finishing anodic oxidation after detecting an end-point of oxidation reaction of the electrode,
    wherein the measured resonant frequency of the piezoelectric substrate is an average of resonant frequencies that are measured for the individual surface acoustic wave elements formed at a plurality of preset positions on the piezoelectric substrate.

5. A surface acoustic wave element that is manufactured by the method for manufacturing a surface acoustic wave element according to claim 4.

6. The method for manufacturing a surface acoustic wave element according to claim 4, wherein the anodic oxidation step is finished at a preset time after detecting the end-point.

7. The method for manufacturing a surface acoustic wave element according to claim 4, wherein the frequency measurement step, the voltage calculation step, and the anodic oxidation step are repeated a plurality of times.

* * * * *